United States Patent
Isom et al.

(10) Patent No.: US 9,468,103 B2
(45) Date of Patent: Oct. 11, 2016

(54) INTERCONNECT TRANSITION APPARATUS

(71) Applicant: Raytheon Company, Waltham, MA (US)

(72) Inventors: Robert S. Isom, Allen, TX (US); Justin Kasemodel, McKinney, TX (US); James M. Elliott, Allen, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/509,393

(22) Filed: Oct. 8, 2014

(65) Prior Publication Data
US 2016/0105963 A1    Apr. 14, 2016

(51) Int. Cl.
*G06K 7/10* (2006.01)
*H05K 1/14* (2006.01)
*H01Q 1/50* (2006.01)
*H05K 1/02* (2006.01)
*H05K 3/36* (2006.01)

(52) U.S. Cl.
CPC .................. *H05K 1/14* (2013.01); *H01Q 1/50* (2013.01); *H05K 1/0213* (2013.01); *H05K 1/144* (2013.01); *H05K 3/366* (2013.01); *H05K 1/145* (2013.01); *H05K 2201/10098* (2013.01)

(58) Field of Classification Search
CPC .. H01R 12/52; H01R 12/714; H01R 12/724; H01R 12/732; H01R 24/50; H01Q 21/0087; H05K 7/1444; H05K 1/14; H05K 1/0213; H05K 1/144; H05K 1/145; H05K 3/366; H05K 2201/10098; G06F 1/18; H05Q 1/50
USPC .................................................. 235/462.43
See application file for complete search history.

(56) References Cited

U.S. PATENT DOCUMENTS

| | | | | |
|---|---|---|---|---|
| 3,414,892 A | * | 12/1968 | McCormack | H05K 3/368 174/261 |
| 3,528,050 A | | 9/1970 | Hindenburg | |
| 3,624,587 A | * | 11/1971 | Conrad | H05K 3/366 174/263 |
| 3,960,424 A | * | 6/1976 | Weisenburger | 439/66 |
| 4,479,686 A | * | 10/1984 | Hoshino et al. | 439/78 |
| 4,690,471 A | | 9/1987 | Marabotto | |
| 5,060,369 A | * | 10/1991 | Date | H05K 3/366 29/830 |

(Continued)

FOREIGN PATENT DOCUMENTS

| | | |
|---|---|---|
| EP | 1467430 | 10/2004 |
| EP | 2154747 | 2/2010 |

(Continued)

OTHER PUBLICATIONS

International Search Report issued in PCT/US2015/043563; mailed Oct. 27, 2015; 5 pages.

(Continued)

*Primary Examiner* — Thien M Le
*Assistant Examiner* — Claude J Brown
(74) *Attorney, Agent, or Firm* — Cantor Colburn LLP

(57) ABSTRACT

A transition apparatus for connecting first and second circuit boards is provided. The transition apparatus includes a beam having edges and a length defined between the edges, beam circuitry running along the length of the beam and connections disposed at the edges of the beam to connect the beam circuitry with respective circuitry of the first and second circuit boards at respective interior, opposing surfaces thereof.

20 Claims, 3 Drawing Sheets

(56) References Cited

U.S. PATENT DOCUMENTS

| | | | | |
|---|---|---|---|---|
| 5,146,308 | A | * | 9/1992 | Chance .................. H01L 24/02 257/782 |
| 5,244,395 | A | * | 9/1993 | DeSantis ............... H05K 3/366 439/65 |
| 5,338,207 | A | * | 8/1994 | Lineberry et al. ............. 439/62 |
| 5,355,283 | A | * | 10/1994 | Marrs et al. ................. 361/760 |
| 5,603,620 | A | | 2/1997 | Hinze |
| 5,644,277 | A | | 7/1997 | Gulick |
| 5,661,901 | A | * | 9/1997 | King ................... H01L 25/0657 257/700 |
| 5,886,590 | A | | 3/1999 | Quan |
| 5,938,455 | A | * | 8/1999 | Glovatsky ............. H01R 12/58 439/290 |
| 6,100,775 | A | | 8/2000 | Wen |
| 6,114,221 | A | * | 9/2000 | Tonti ................ H01L 21/76898 257/686 |
| 6,307,160 | B1 | * | 10/2001 | Mei et al. ..................... 174/256 |
| 6,664,867 | B1 | | 12/2003 | Chen |
| 6,830,460 | B1 | * | 12/2004 | Rathburn ........................ 439/66 |
| 6,882,247 | B2 | | 4/2005 | Allison |
| 6,935,866 | B2 | | 8/2005 | Kerekes |
| 6,950,062 | B1 | * | 9/2005 | Mather et al. ................ 342/372 |
| 7,132,990 | B2 | | 11/2006 | Stenger |
| 7,193,490 | B2 | | 3/2007 | Shimoda |
| 7,444,736 | B1 | | 11/2008 | Warning |
| 8,035,992 | B2 | | 10/2011 | Kushta |
| 8,753,145 | B2 | | 6/2014 | Lang |
| 2002/0024348 | A1 | * | 2/2002 | Jones et al. ................... 324/754 |
| 2002/0037656 | A1 | * | 3/2002 | Murakami ...................... 439/74 |
| 2002/0139579 | A1 | * | 10/2002 | Kwark ......................... 174/262 |
| 2003/0020654 | A1 | | 1/2003 | Navarro et al. |
| 2004/0188836 | A1 | * | 9/2004 | Key et al. ..................... 257/738 |
| 2005/0095896 | A1 | * | 5/2005 | Tutt .............................. 439/342 |
| 2005/0269693 | A1 | | 12/2005 | Green et al. |
| 2007/0173080 | A1 | * | 7/2007 | Johnson et al. ................ 439/66 |
| 2008/0102702 | A1 | * | 5/2008 | Sercu et al. ................... 439/608 |
| 2009/0197435 | A1 | * | 8/2009 | Jessup .................... H05K 3/366 439/65 |
| 2009/0213562 | A1 | * | 8/2009 | Thevenard ............... H01Q 1/38 361/803 |
| 2009/0322620 | A1 | * | 12/2009 | Pedersen ............ H01Q 21/0087 343/702 |
| 2010/0053026 | A1 | * | 3/2010 | Van Der Poel ............... 343/908 |
| 2010/0112826 | A1 | | 5/2010 | Frasco |
| 2010/0186997 | A1 | * | 7/2010 | Vicich .................. H05K 3/3478 174/254 |
| 2012/0034820 | A1 | | 2/2012 | Lang |
| 2012/0212920 | A1 | * | 8/2012 | Schreffler ............. H05K 3/366 361/803 |
| 2012/0287581 | A1 | | 11/2012 | Sauerbier |
| 2013/0003330 | A1 | * | 1/2013 | Chen ...................... H05K 1/141 361/760 |
| 2013/0175078 | A1 | | 7/2013 | Pai |
| 2013/0194754 | A1 | | 8/2013 | Jung |
| 2013/0314292 | A1 | | 11/2013 | Maley |
| 2013/0335931 | A1 | * | 12/2013 | Snider ................. H05K 3/3436 361/751 |
| 2014/0004745 | A1 | * | 1/2014 | Komoto et al. ............. 439/626 |
| 2014/0152510 | A1 | * | 6/2014 | Manry et al. ......... 343/700 MS |

FOREIGN PATENT DOCUMENTS

| | | |
|---|---|---|
| EP | 2626897 | 8/2013 |
| EP | 2704259 A2 | 3/2014 |
| FR | 2575336 | 6/1986 |
| GB | 2508679 A | 6/2014 |
| JP | H11121896 | 4/1999 |
| JP | H11145648 | 5/1999 |
| JP | 2013060037 | 4/2013 |

OTHER PUBLICATIONS

Written Opinion issued in PCT/US2015/043563; mailed Oct. 27, 2015; 5 pages.

Invitation to Pay Additional Fees, PCT Application No. PCT/US2015/056848, mailed Jan. 11, 2016, pp. 1-6.

* cited by examiner

INTERCONNECT TRANSITION APPARATUS

BACKGROUND

The present invention relates to interconnections and, more specifically, to interconnect transition apparatuses.

In the implementation of a transition, a first part often includes a circuit board and a second part often includes another circuit board. The first and second parts are generally displaced from one another at a given distance, and thus it is frequently necessary to provide for "vertical" transitions between the board of the first part and the board(s) of the second part. Such vertical transitions should be small to provide for miniaturized spacings and low costs given the potential for large number of transitions per assembly.

Currently, vertical transitions for electronic assemblies are commonly designed with connectors and bullets disposed between circuit boards and remainders of corresponding circuits. This generally requires at least two connectors and a bullet per transition, which typically becomes a significant portion of the cost of the system. However, as circuit spacing shrinks or density increases, connector and bullet fittings tend to limit miniaturization due to their large physical sizes.

In some cases, it is actually not possible to fit two connectors and a bullet in an available space for a given design. Such situations then require machined assemblies using pogo pins, fuzz buttons or coaxial feed structures be employed in the transition. However, since these components lead to increased fabrication and assembly costs and are not easy to automatically assembly, they can result in much more expensive systems.

SUMMARY

According to one embodiment of the present invention, a transition apparatus for connecting first and second circuit boards is provided. The transition apparatus includes a beam having edges and a length defined between the edges, beam circuitry running along the length of the beam and connections disposed at the edges of the beam to connect the beam circuitry with respective circuitry of the first and second circuit boards at respective interior, opposing surfaces thereof.

According to another embodiment, transition apparatus for connecting first and second circuit boards is provided and includes a beam having edges and a length defined between the edges, the beam being transversely disposable with respect to the first and second circuit boards, beam circuitry running along the length of the beam and connections disposed at the edges of the beam by which first and second ends of the beam circuitry are connectable with respective circuitry of the first and second circuit boards.

According to yet another embodiment, an antenna array is provided. The antenna array includes a first circuit board comprising an array of radiator elements and a first surface, a second circuit board comprising feed electronics and a second surface oppositely facing the first surface and a transition apparatus. The transition apparatus includes a plurality of beams, each beam having edges and a length defined between the edges, beam circuitry running along the length of the beam and connections disposed at the edges of the beam to connect the beam circuitry with the radiator elements at the first surface and with the feed electronics at the second surface.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
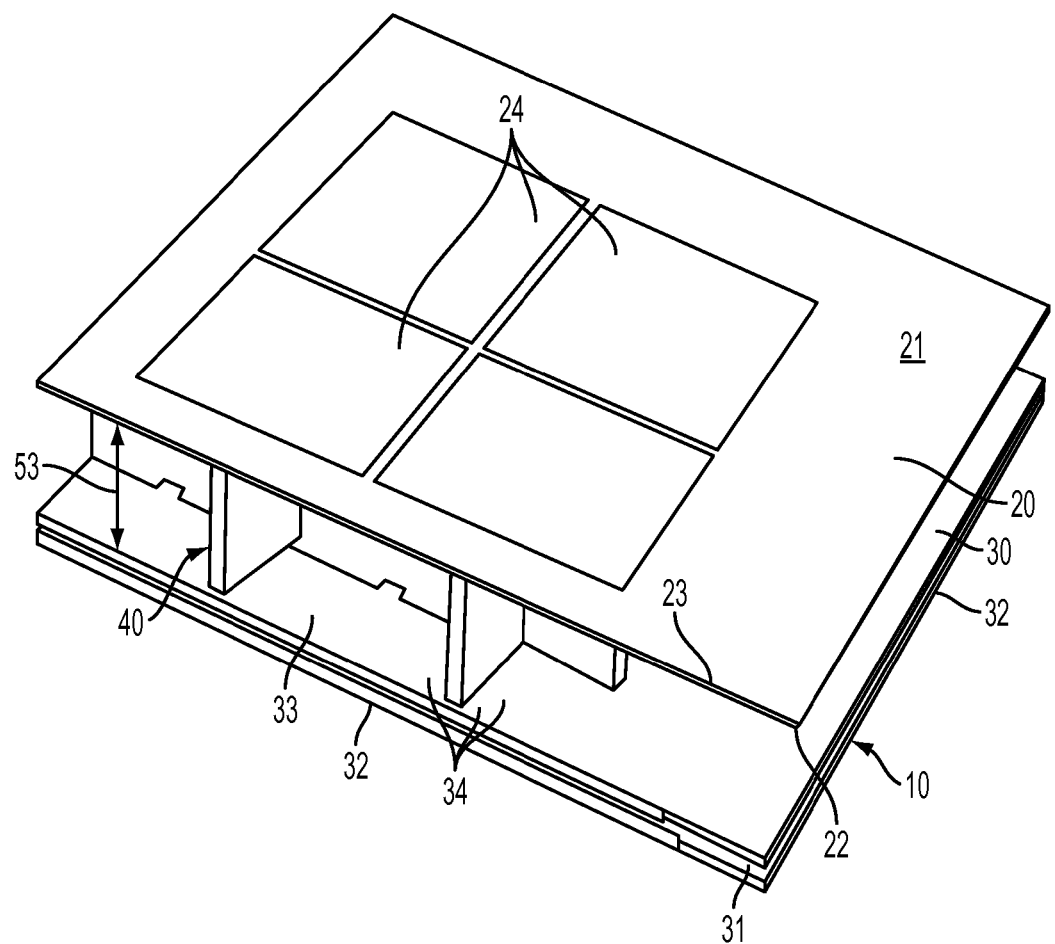
FIG. 1 is a perspective view of an antenna array in accordance with embodiments.

As will be described below, a vertical transition apparatus that is automated for solder reflow processing is provided and may be disposed for connecting circuit boards of an antenna array in an exemplary case. The vertical transition apparatus uses a multilayer printed circuit board design with solderable castellations on both the top and bottom edges to provide multiple connection points per face and per array channel. It may provide for low loss, low cost implementation of an antenna array design or of a design for a similar device.

With reference to FIGS. 1-5, an antenna array 10 is provided for use in various fields and technologies. The antenna array 10 includes a first circuit board 20 and a second circuit board 30. The first circuit board 20 includes a substrate 21, an interior or first surface 22, a second surface 23, which is opposite the first surface 22, and an array of radiator elements 24, which are disposed on the second surface 23 to face toward an exterior of the antenna array. The second circuit board 30 includes a substrate 31, a first surface 32, an interior or second surface 33 and a plurality of components 34 (see FIG. 3), such as baluns, manifolding, circuit structures and feed structures related to operations of the antenna array 10. The second surface 33 is complementary to the first surface 22 in that the second surface 33 is opposite and disposed at a distance from the first surface 22.

The antenna array 10 further includes a transition apparatus 40. The transition apparatus 40 includes a plurality of beams 50 disposed between the first and second circuit boards 20 and 30 with each beam 50 having edges 51, 52 (see FIG. 5) and a length 53 defined between the edges 51, 52. In accordance with embodiments, each beam 50 may be elongate and the edges 51, 52 may be defined as longitudinal edges such that the length 53 represents a longitudinal length of the beam 50. Moreover, each beam 50 may be disposed to form right angles at the edges 51, 52 with each of the first and second circuit boards 20 and 30, respectively, such that the length 53 of the beam represents a distance between the first and second circuit boards 20 and 30.

Figure 2:
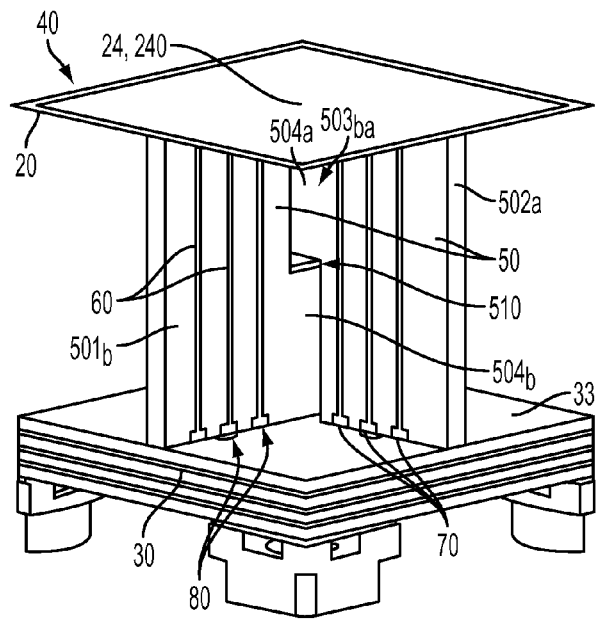
FIG. 2 is a perspective view of a portion of the antenna array of FIG. 1.
Figure 3:
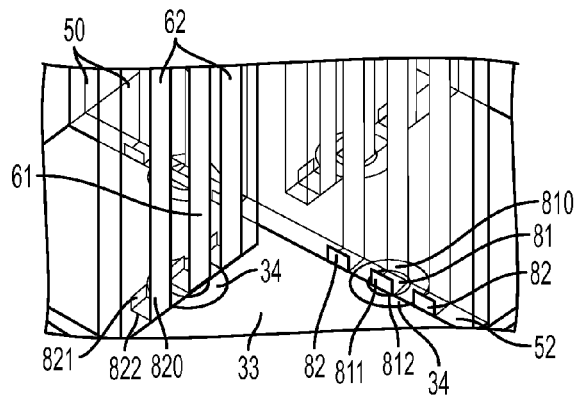
FIG. 3 is an enlarged view of castellations of the portion of the antenna array of FIG. 2.
Figure 4:
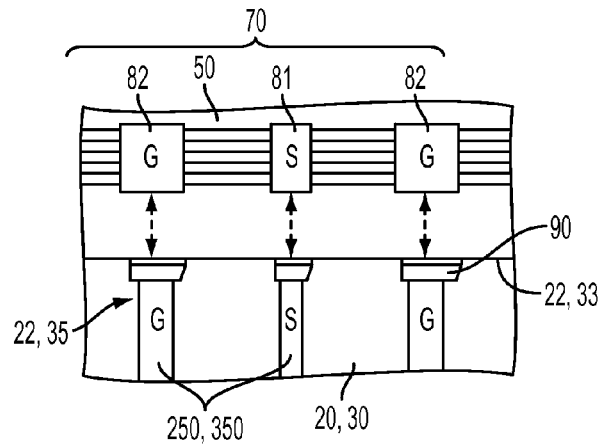
FIG. 4 is a side view of the castellations of FIG. 3.

The transition apparatus 40 further includes beam circuitry 60 for each beam 50 that is disposed to run along the length 53 of the beam 50 and connections 70 (see FIGS. 2-4). For each beam 50, the connections 70 are disposed at the edges 51, 52 to connect the beam circuitry 60 with or to the radiator elements 24 at the first surface 22 of the first circuit board 20 and to connect the beam circuitry 60 with the components 34 (i.e., the feed electronics) at the second surface 33 of the second circuit board 30.

In accordance with embodiments, the beam circuitry 60 may include one or more signal components 61 and one or more ground components 62. Such signal and ground components 61 and 62 may be disposed along at least a portion of the length 53 of the corresponding beam 50.

In greater detail, the first circuit board 20 includes the radiator elements 24 at the first surface 22 as well as circuitry 25 that extends from the radiator elements 24 at the first surface 22, through the substrate 21 and, in some cases, to the second surface 23. Thus, the circuitry 25 of the first circuit board 20 may include internal and surface-level traces 250 running through the substrate 21 from the first surface 22 to the second surface 23 and vice versa and along the first and second surfaces 22 and 23. Similarly, the second circuit board 30 includes the plurality of components 34 as well as circuitry 35 that extends from the components 34, through the substrate 31 and between and along the first and second surfaces 32 and 33. Thus, the circuitry 35 of the second circuit board 30 may include internal and surface-level traces 350 running through the substrate 31 and between and along the first and second surfaces 32 and 33.

With the circuitry 25 and 35 so configured, the connections 70 are disposed at or near to the first surface 22 of the first circuit board 20 and at or near to the second surface 33 of the second circuit board 30. In other words, the connections 70 are formed at the internal, opposing surfaces of the antenna array 10 transition apparatus 40.

In accordance with embodiments, the connections 70 may include castellations 80 and reflowed solder 90 extending from the castellations 80 to the internal circuit traces 250/350. In accordance with further embodiments and, in particular, where the beam circuitry 60 includes the signal and ground components 61 and 62, the castellations 80 may be provided in groups. Such groups may include, for example, a signal castellation 81 and ground castellations 82 that are disposed on opposite sides of the signal castellation 81 (see FIG. 4). This configuration would correspond to the configuration illustrated in FIG. 3 with the signal castellation 81 being coupled to the signal component 61 and the ground castellations 82 being respectively coupled to the ground component 62.

The castellations 80 may be provided with U-shaped configurations so that the castellations 80 wrap around the edges 51, 52 of the corresponding beam 50. For the signal component 61, the corresponding signal castellation 81 includes a first leg 810, a second leg 811 and a third leg 812. As shown in FIG. 3, the first leg 810 runs longitudinally along an external surface of the beam 50 toward the edge 52 and may include a tapered portion that is tapered in at least one or both of depth-wise and lateral directions, the second leg 811 runs longitudinally along the other external surface of the beam 50 away from the edge 52 and the third leg 812 runs along the edge 52 in the depth-wise direction to thereby connect the first and second legs 810 and 811. The reflowed solder 90 connects generally with at least the third leg 812.

Similarly, for the ground component 62, each of the corresponding ground castellations 82 includes a first leg 820, a second leg 821 and a third leg 822. As shown in FIG. 3, the first leg 820 runs longitudinally along an external surface of the beam 50 toward the edge 52 and may include a tapered portion that is tapered in at least one or both of depth-wise and lateral directions, the second leg 821 runs longitudinally along the other external surface of the beam 50 away from the edge 52 and the third leg 822 runs along the edge 52 in the depth-wise direction to thereby connect the first and second legs 820 and 821. The reflowed solder 90 connects generally with at least the third leg 822.

In accordance with still further embodiments, the castellations 80 may include any type of castellation configuration and material. For example, at least one or more of the castellations 80 may be provided as a hot air solder leveling (HASL) or as electroless nickel/immersion gold (ENIG) castellations.

Figure 5:
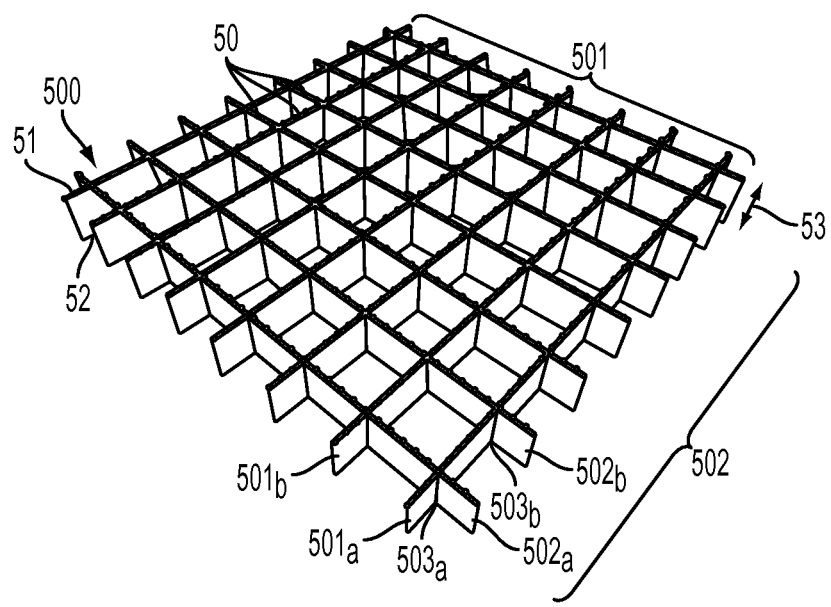
FIG. 5 is a perspective view of a plurality of beams of the antenna array of FIG. 1 in a crisscross formation.

While conventional transitions between circuit boards permit about 18 GHz transmissions, the transition apparatus 40 described herein may be configured to support broadband transmission of up to about 30 GHz between the first circuit board 20 and the second circuit board 30. Such broadband capability is enabled by the provision of signal and ground components 61 and 62 in the beam circuitry 60 as well as the flexibility of small feature sizes for the castellations 80 (i.e., about 10 mil castellation with about 5 mil separation and/or potential for about 195 or more soldered connections per square inch). Moreover, the beam 50 may be formed of a material that is impedance matched to at least one or both of the first and second circuit boards 20 and 30, while the geometry of the beam 50 as a whole may be variable for different particular applications. As an example, the beam 50 may be formed of Rogers 4350B or other materials that are compatible with FR4 processing With reference to FIGS. 2 and 5, the plurality of beams 50 may be provided in a crisscross formation 500. This crisscross formation 500 may have any overall shape (e.g., square, rectangular, hexagonal, octagonal, circular, etc.), though the present discussion will relate to the illustrated case of the crisscross formation 500 having a square/rectangular overall shape. As shown in FIG. 5, the plurality of beams 50 includes a first group of beams 501 that are parallel with one another and extend in a first direction and a second group of beams 502 that are parallel with one another and extend in a second direction, which is transverse or perpendicular to the first direction. Thus, beam $501_a$ crosses beams $502_{a-n}$ at crossings $503_{aa-an}$, beam $501_b$ crosses beams $502_{a-n}$ at crossings $503_{ba-bn}$ and so on.

As shown in FIG. 2, in order to promote the fitting of the first and second groups of beams 50 and 502, the plurality of beams 50 include a notch 510 at each crossing $503_{an-an}$, $503_{ba-bn}$, etc. That is, at crossing $503_{ba}$, beam $501_b$ extends longitudinally from the second circuit board 30 to a first point midway between the first and second circuit boards 20 and 30 to define notched portion $504_b$ and beam 502a extends longitudinally from the first circuit board 20 to a second point midway between the first and second circuit boards 20 and 30 to define notched portion $504_a$. The first and second points are separated from one another to allow for machining tolerances, non-planarities and other assembly errors.

In general, the total height of a pair of complementary notched portions $504_{a/b}$ will be slightly less than a distance between the first and second circuit boards 20 and 30 at a corresponding location with the deficiency defining a distance between the corresponding first and second points. In accordance with various embodiments, the pair of complementary notched portions $504_{a/b}$ may have similar (though opposite) heights or, in some cases where a local portion of a corresponding circuit board is expected to deform, one may be taller than the other to provide for added rigidity. In accordance with further embodiments, a direction of notching may be consistent throughout the entire antenna array 10 or along a given one of the plurality of beams 50. Alternatively, the direction of the notching may be switch or staggered in accordance with predefined or randomized patterns.

During assembly processes, the first group of beams 501 may be connected individually, sequentially and/or en masse to the circuitry 25 of the first circuit board 20 by way of the connections 70 of reflowed solder 90 between the signal and ground castellations 81 and 82 of each individual beam 50 with the circuit traces 250. Similarly, the second group of beams 502 may be connected individually, sequentially and/or en masse to the circuitry 35 of the second circuit board 30 by way of the connections 70 of reflowed solder 90 between the signal and ground castellations 81 and 82 of each individual beam 50 with the circuit traces 350. Once these operations are complete, the first and second circuit boards 20 and 30 along with their respective beam groups are interfaced with one another. Subsequently, the first group of beams 501 may be connected individually, sequentially and/or en masse to the circuitry 35 of the second circuit board 30 by way of the connections 70 of reflowed solder 90 between the signal and ground castellations 81 and 82 of each individual beam 50 with the circuit traces 350 while the second group of beams 502 may be connected individually, sequentially and/or en masse to the circuitry 25 of the first circuit board 20 by way of the connections 70 of reflowed solder 90 between the signal and ground castellations 81 and 82 of each individual beam 50 with the circuit traces 250.

In accordance with an alternative assembly process, the first and second groups of beams 501 and 502 may be interfaced with one another and held in place by external support structures (e.g., vices, jigs, etc.). Subsequently, the first group of beams 501 may be connected individually, sequentially and/or en masse to the circuitry 25, 35 of the first and second circuit boards 20 and 30 by way of the connections 70 of reflowed solder 90 between the signal and ground castellations 81 and 82 of each individual beam 50 with the circuit traces 250, 350. At the same time, the second group of beams 502 may be connected individually, sequentially and/or en masse to the circuitry 25, 35 of the first and second circuit boards 20 and 30 by way of the connections 70 of reflowed solder 90 between the signal and ground castellations 81 and 82 of each individual beam 50 with the circuit traces 250, 350.

Figure 6:
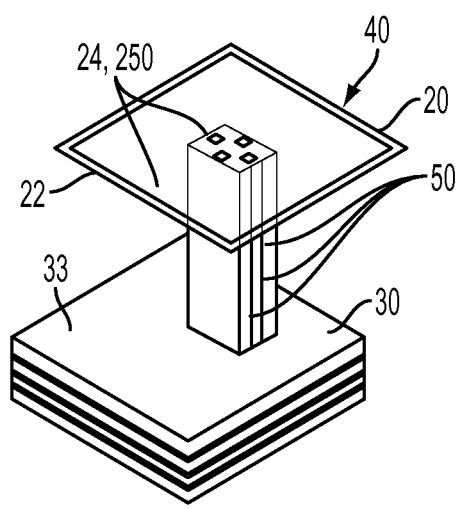
FIG. 6 is a perspective view of a portion of an antenna array in accordance with alternative embodiments.

The array of radiator elements 24 may be provided as an array of generally octagonal or polygonal-shaped radiators 240 (see FIG. 2) that may, in some cases, assume the configuration of the plurality of beams 50. That is, if the plurality of beams 50 has the crisscross formation 500 discussed above, the array of radiator elements 24 or the array of generally octagonal or polygonal-shaped radiators 240 will have a similarly x-shaped configuration. However, with reference to FIG. 6, it will be understood that the array of radiator elements 24 may be provided in other configurations as well, such as an array of small and large radiators 250. In this or other cases, plurality of beams 50 may be grouped together in relatively small groups of about 3 where the beams 50 in the small group are disposed to abut in face-to-face formation. Thus, in a corresponding antenna array 10, the plurality of beams 50 would take the form of a series of pylons disposed in correspondence to the common central points of the array of tapered radiators 250.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The described embodiments were chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A transition apparatus for connecting first and second circuit boards, comprising:
   a unitary beam having edges respectively disposable at a corresponding surface of one of the first and second circuit boards and a length defined from one of the edges to the other of the edges;
   beam circuitry running along a substantial entirety of the length of the unitary beam; and
   connections disposable at the edges of the unitary beam by which the beam circuitry is connectable with respective circuitry of the first and second circuit boards at respective connection planes that are displaced into the first and second circuit boards from respective planes of interior, opposing surfaces thereof such that portions of the edges of the unitary beam remote from the connections are disposable in flush abutment with the respective interior, opposing surfaces.

2. The transition apparatus according to claim 1, wherein the beam circuitry comprises signal and ground components.

3. The transition apparatus according to claim 1, wherein the connections comprise castellations.

4. The transition apparatus according to claim 3, wherein the connections further comprise reflowed solder.

5. A transition apparatus for connecting first and second circuit boards, comprising:
   a unitary beam having edges respectively disposed at a corresponding surface of one of the first and second circuit boards and a length defined from one of the edges to the other of the edges,
   the unitary beam being transversely disposed with respect to the first and second circuit boards;

beam circuitry running along a substantial entirety of the length of the unitary beam; and connections by which first and second ends of the beam circuitry are connected with respective circuitry of the first and second circuit boards, the connections being disposed at the edges of the unitary beam and at respective connection planes that are displaced into the first and second circuit boards from respective planes of interior, opposing surfaces thereof such that portions of the edges of the unitary beam remote from the connections are disposable in flush abutment with the respective interior, opposing surfaces.

6. The transition apparatus according to claim 5, wherein the transition apparatus supports broadband transmission of up to about 30 GHz between the first and second circuit boards.

7. The transition apparatus according to claim 5, wherein connections between the first and second ends of the beam circuitry and the circuitry of the first and second circuit boards are disposed as reflowed solder at interior, opposing surfaces of the first and second circuit boards.

8. The transition apparatus according to claim 5, wherein the unitary beam comprises a material that is impedance matched to at least one of the first and second circuit boards.

9. The transition apparatus according to claim 5, wherein the beam circuitry comprises signal and ground components, which are adjacent along at least a portion of the length of the unitary beam.

10. The transition apparatus according to claim 5, wherein the connections are provided in groups including a signal castellation and ground castellations on opposite sides of the signal castellation.

11. The transition apparatus according to claim 5, wherein the connections are U-shaped and wrap around the edges of the unitary beam, the connections comprising first and second legs that run longitudinally along proximal portions of opposite external surfaces of the corresponding unitary beam toward and away from the corresponding edge and a third leg that runs along the edge to connect the first and second legs and protrudes beyond a plane of the edge.

12. The transition apparatus according to claim 5, wherein the connections comprise a hot air solder leveling (HASL) or electroless nickel/immersion gold (ENIG) castellations.

13. The transition apparatus according to claim 5, further comprising:

a second unitary beam having edges respectively disposed at a corresponding surface of one of the first and second circuit boards and a length defined from one of the edges to the other of the edges, the second unitary beam being transversely disposed with respect to the first and second circuit boards;

beam circuitry running along a substantial entirety of the length of the second unitary beam; and connections disposed by which first and second ends of the beam circuitry are connected with the circuitry of the first and second circuit boards, respectively, the connections being disposed at the edges of the second unitary beam and at respective connection planes that are displaced into the first and second circuit boards from respective planes of interior, opposing surfaces thereof such that portions of the edges of the second unitary beam remote from the connections are disposable in flush abutment with the respective interior, opposing surfaces.

14. The transition apparatus according to claim 13, wherein the unitary beam and the second unitary beam are disposed in a cross formation with respective notches.

15. The transition apparatus according to claim 14, wherein the notches are disposed at a distance from one another.

16. The transition apparatus according to claim 13, wherein the unitary beam and the second unitary beam are disposed to abut one another in a face-to-face formation.

17. An antenna array, comprising:

a first circuit board comprising an array of radiator elements and a first surface;

a second circuit board comprising feed electronics and a second surface oppositely facing the first surface; and a transition apparatus comprising:

a plurality of unitary beams, each unitary beam having edges respectively disposed at a corresponding one of the first and second surfaces and a length defined from one of the edges to the other of the edges;

beam circuitry running along a substantial entirety of the length of each of the unitary beams; and connections disposed to connect the beam circuitry with the array of radiator elements and with the feed electronics, the connections being disposed at the edges of each of the unitary beams and at respective connection planes that are displaced into the first and second circuit boards from respective planes of the first and second surfaces such that portions of the edges of each of the unitary beams remote from the connections are disposable in flush abutment with the respective interior, opposing surfaces.

18. The antenna array according to claim 17, wherein at least one of the first and second boards comprises internal circuit traces and the connections comprise:

castellations; and reflowed solder extending from the castellations to the internal circuit traces, wherein the reflowed solder is recessed from the respective planes of the first and second surfaces.

19. The antenna array according to claim 17, wherein the plurality of unitary beams has a crisscross formation with each unitary beam being notched at a beam crossing to maintain a separation between crisscrossing unitary beams.

20. The antenna array according to claim 17, wherein each unitary beam forms a right angle with respect to each of the first and second circuit boards.

* * * * *